United States Patent
Koprowski et al.

(10) Patent No.: US 6,327,685 B1
(45) Date of Patent: Dec. 4, 2001

(54) LOGIC BUILT-IN SELF TEST

(75) Inventors: Timothy J. Koprowski, Newburgh; Franco Motika, Hopewell, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/310,444

(22) Filed: May 12, 1999

(51) Int. Cl.[7] .................................................. G01R 31/28
(52) U.S. Cl. ........................ 714/733; 714/725; 714/726; 714/732; 714/734; 714/739; 365/201
(58) Field of Search .................... 714/733, 718, 714/719, 724, 725, 726, 728, 739, 736, 738; 708/230; 365/200, 201, 210, 154, 189.03, 226

(56) References Cited

U.S. PATENT DOCUMENTS

| | | | |
|---|---|---|---|
| 4,071,902 | 1/1978 | Eichelberger et al. | 708/230 |
| 4,688,222 | 8/1987 | Blum | 714/732 |
| 4,841,485 | 6/1989 | Prilik et al. | 365/201 |
| 5,150,366 | * 9/1992 | Bardell et al. | 714/728 |
| 5,239,262 | 8/1993 | Grutzner et al. | 714/733 |
| 5,278,842 | 1/1994 | Berry, Jr. et al. | 714/726 |
| 5,313,424 | 5/1994 | Adams et al. | 365/200 |
| 5,488,612 | 1/1996 | Heybruck | 714/725 |
| 5,535,164 | 7/1996 | Adams et al. | 365/201 |
| 5,553,082 | * 9/1996 | Conner et al. | 714/733 |
| 5,557,619 | * 9/1996 | Rapoport | 714/733 |
| 5,633,877 | * 5/1997 | Shephard, III et al. | 714/725 |
| 5,659,551 | 8/1997 | Huott et al. | 714/725 |
| 5,661,732 | 8/1997 | Lo et al. | 714/725 |
| 5,790,564 | 8/1998 | Adams et al. | 714/738 |

OTHER PUBLICATIONS

"Built–In Test for Complex Integrated Circuits", B. Chinaman, J. Much, G. Zwiehoff, IEEE Journal of solid State Circuits, vol. SC–15, pp. 315–318, Jun. 1980.

"Circular Self–Test Path: A Low–Cost Bist Technique", Andrzej Krasniewski, Technical University of Warsaw, Oct. 2, 1986.

W. H. McAnney et al., "Improving the Diagnostic Resolution of Built–In Test" Jan. 1988, IBM Technical Disclosure Bulletin vol. 30, No. 8, pp. 478–480.

E. M. Barna, "Self–Test Diagnosis Using Parallel Superposition" Jul. 1985, IBM Technical Disclosure Bulletin vol. 28 No. 2, pp. 609–614.

W. H. McAnney, "Diagnosis of Self–Test Failures" Feb. 1984, IBM Technical Disclosure Bulletin vol. 26, No. 9, pp. 4483–4488.

* cited by examiner

*Primary Examiner*—Emmanuel L. Moise
(74) *Attorney, Agent, or Firm*—Lynn Augspurger; Cantor Colburn LLP

(57) ABSTRACT

A BIST method that modifies the scan chain path and scan clocks to allow for distributed BIST test. In this distributed BIST concept, the Linear Feedback Shift Register (LFSR) and the Multiple Input Signature Register (MISR) are combined as an integral part of the scan chain, and each scan cycle is utilized as a test cycle.

8 Claims, 6 Drawing Sheets

LOGIC BUILT-IN SELF TEST

FIELD OF THE INVENTION

This invention relates to an improved logic built in self test (LBIST) system and more particularly to a LBIST with distributed SRSG and MISR functions, which facilitate scan vector loading and signature generation.

Trademarks: S/390 and IBM are registered trademarks of International Business Machines Corporation, Armonk, N.Y., U.S.A. and Lotus is a registered trademark of its subsidiary Lotus Development Corporation, an independent subsidiary of International Business Machines Corporation, Armonk, N.Y. Other names may be registered trademarks or product names of International Business Machines Corporation or other companies.

REFERENCES

"Built-In Test for Complex Digital Integrated Circuits", B. Könemann, J. Mucha, G. Zwiehoff, IEEE Journal of Solid State Circuits, Vol. SC-15 No. 3, pp. 315–319, June 1980.

"Circular Self-Test Path: A Low-Cost Bist Technique", Andrzej Krasniewski, presented Jul. 7, 1987 at Princeton Univesity.

U.S. Pat. No. 4,071,902 to E. Eichelberger et al.

U.S. Pat. No. 5,150,366 to P. Bardell et al.

BACKGROUND

As will be appreciated by those skilled in the art, as the design of electronic integrated circuit chips and devices has progressed, more and more circuitry is being disposed in increasingly dense patterns and it is becoming correspondingly more difficult to test such circuits. One methodology for performing chip test is described in U.S. Pat. No. 4,071,902 issued to Edward Eichelberger, et al. on Jan. 31, 1978 and assigned to the same assignee as the present invention and incorporated herein by reference. This patent describes the basic features of a level sensitive scan design (LSSD), which is used to facilitate circuit test. The circuits generally considered in LSSD include digital circuits having logic and memory functions used in the design and construction of digital signal processing and information handling systems and machines. Similarly, integrated circuit devices of interest typically possess blocks of combinatorial logic whose inputs and outputs are supplied to certain memory elements. In particular, in an LSSD system the memory elements or circuits comprise shift register latches (SRLs).

A prior art method referred to as self-test using MISR/Parallel SRSG (STUMPS) is used to test integrated circuit chips and devices. The acronym SRSG stands for the Shift Register Sequence Generator. Such devices are typically implemented as linear feedback shift registers. These registers generally comprise a chain of shift register elements in which Exclusive-OR elements in a feedback loop are provided so as to combine several intermediate latch output signals which are returned to the shift register input. The feedback paths are configured to result in the generation of a pseudo-random sequence of binary digits which are employed as test sequences for the above mentioned combinational circuits. The design and construction of pseudo-random pattern generators in the form of linear feedback shift registers is well known in the art. Output signals from the SRSG are fed through channels to a plurality of different scan paths. Each scan path comprises a plurality of shift register latches. The combinational logic output signals captured in the latch strings are supplied to a multiple input signature register or MISR. It will be appreciated by those skilled in the art, that the shift register latch elements also function in normal operation as, for example, sequential circuit memory elements in conjunction with combinatorial logic networks on, for example, a chip. During operation of the circuit in normal system environment, the shift register latches function as memory elements passing signals to be processed from one combinatorial block to another and at the same time typically receive input signals for subsequent application to combinatorial logic blocks in subsequent clock cycles. Thus the shift register latches play a significant role in establishing and defining stable logic outputs at appropriate points in a machine cycle. It is useful to keep in mind that the SRSG and the MISR are properly considered to be dedicated test elements. However, shift register latches serve a dual purpose which is more particularly apparent when considering the actual signal supplied to the shift register latches in normal operation.

This methodology has evolved mainly in support of LSSD logic and structural testing. The STUMPS structure shown in FIG. 1 illustrates a typical system and chip design that incorporates these concepts. See, for example, U.S. Pat. No. 5,150,366 assigned to the assignee of this patent.

Two basic components of this LBIST structure are a Linear Feedback Shift Register (LFSR) and a Multiple Input Signature Register (MISR). The LFSR serves as a pseudo random pattern generator that provides the stimuli for the logic being tested, while the MISR is utilized to generate a unique signature representing the responses from the logic. Ideally the signature for each failing device is different from the signature of a good device after a predefined number of test cycles.

The configuration of the scan chain in the LBIST test mode is partitioned into several sub-chains of approximately the same length. These chains are loaded and unloaded serially for each LBIST pattern. The pseudo random data loaded in parallel into each sub-chain is supplied by the LFSR and used as test stimuli. Similarly and simultaneously, the state of all latches in the sub-chains are unloaded serially into the MISR forming a signature representing the compressed data.

Each LBIST test pattern, in addition to the loading and unloading of the sub-chains, requires timed application of system clocks to launch the test vector from these latches through the combinational logic and capture the resulting response in the receiving latches. Since a typical system design may consist of several system clocks and various path delays, the clock test sequence and timing set-up may be applied multiple times with different clock combinations and timings. Typically, this is accomplished by an on-product clock generation (OPCG) function and LBIST control.

An LBIST test interval, in turn, consists of a relatively large number of these load/unload sequences followed each by the system clock cycles. At the end of the interval the MISR contents or signature is unloaded and compared to an expected signature. Several signature intervals may be applied to achieve the desired test coverage.

This LBIST methodology is an effective Design for Test (DFT) strategy that can support structural test from the chip level, various package levels, up to the system level. Some of the benefits associated with this approach include relatively low test data volumes, minimal VLSI test system requirements, at-speed test rates, and extendability to system test.

Alternatively, a disadvantage with this methodology is the lengthy test time required in loading and unloading a large number of pseudo random test patterns.

SUMMARY OF THE INVENTION

An object of this invention is the provision of a method to significantly reduce LBIST test time.

Briefly, this invention contemplates a method that modifies the scan chain path and scan clocks to allow for distributed LBIST test In this distributed LBIST concept, the Linear Feedback Shift Register (LFSR) and the Multiple Input Signature Register (MISR) are combined as an integral part of the scan chain, and each scan cycle is utilized as a test cycle.

The concept is further based on design and test ground rules that minimize the impact to system performance, circuit overhead, and maintain compatibility to existing structural scan configurations with:

Minimal impact to system functional paths.

No modification to system clocks.

Transitional fault coverage support.

Compatibility with OPCG & LBIST control.

These scan design modification and new test functions in conjunction with existing LBIST controls provide a compact and effective DFT methodology.

The novel concept at the root of this test methodology is a two phase LBIST sequence that allows alternate SRLs to be configured in either of two test configurations. Depending on the configuration, each SRL can function as a LFSR/MISR element or as a MISR input staging element. Additionally, all SRLs, independent of phase configuration, can launch system data.

DESCRIPTION OF THE DRAWINGS

The foregoing and other objects, aspects and advantages will be better understood from the following detailed description of a preferred embodiment of the invention, in which.

DETAILED DESCRIPTION OF THE INVENTION

Figure 1:
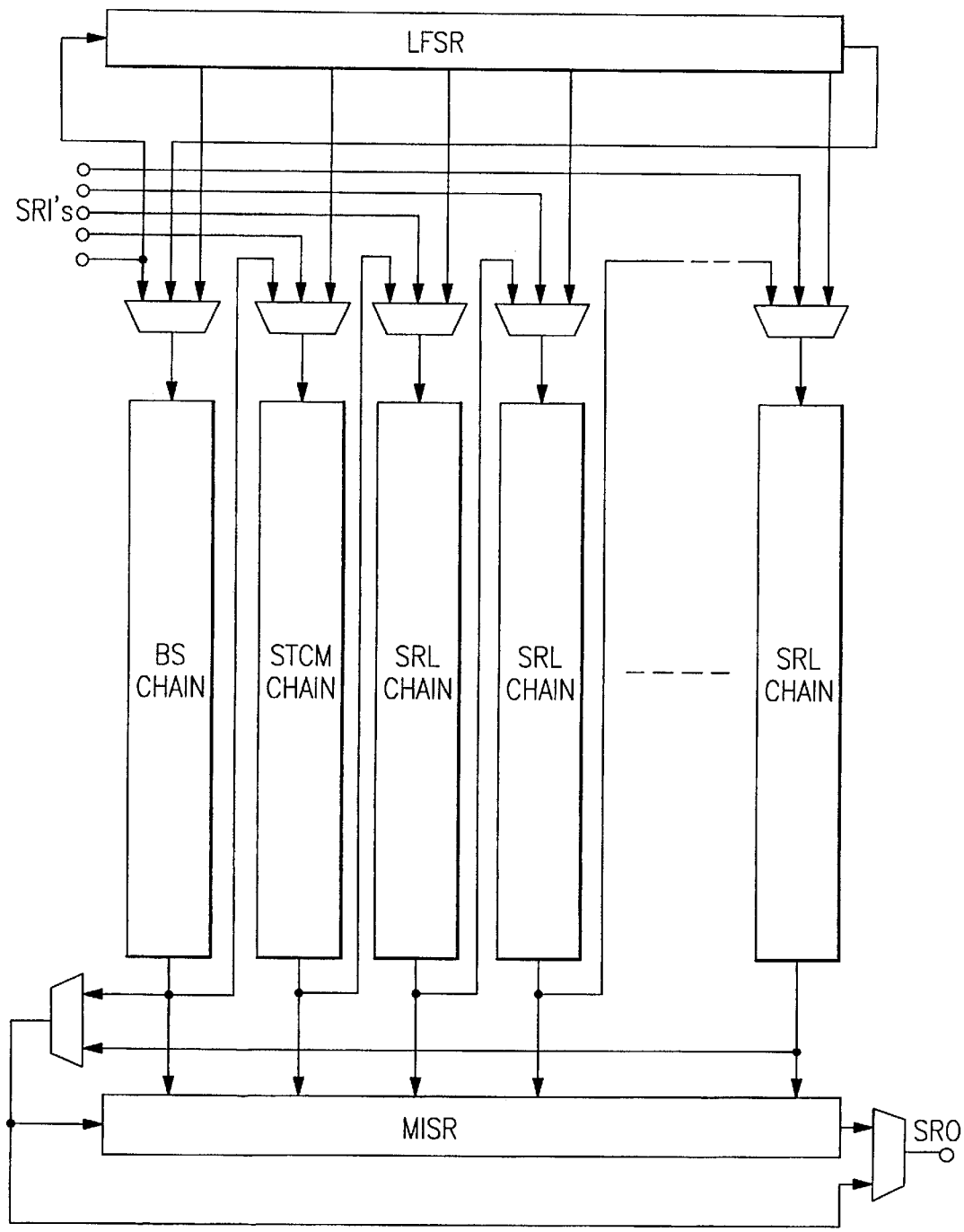
FIG. 1 is block diagram of a typical prior art, STUMPS architecture.
Figure 2:
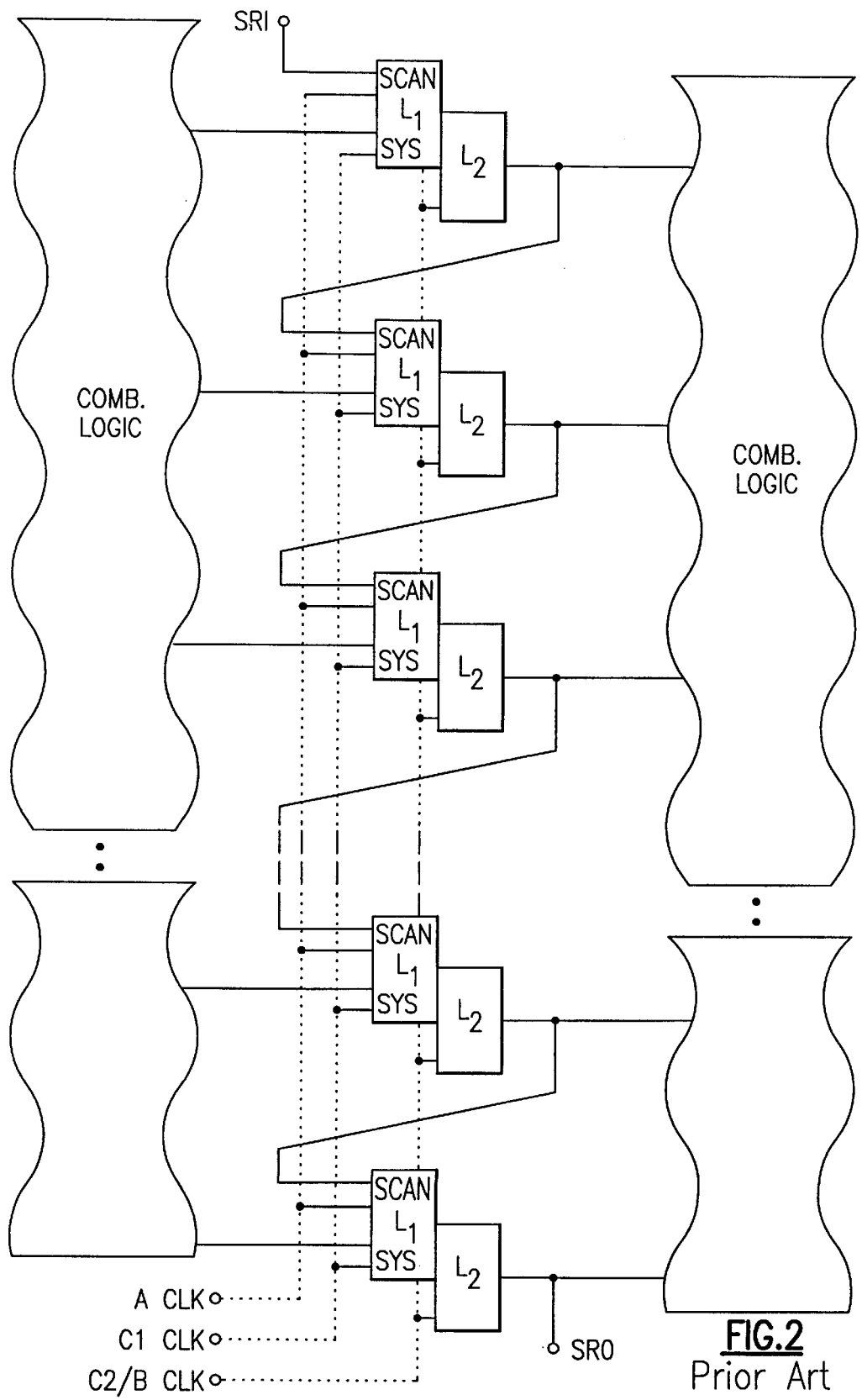
FIG. 2 is a diagram of the typical, prior art, LSSD scan chain configuration of FIG. 1, further illustrating the associated combinational logic.

As illustrated in FIGS. 1 and 2, a typical prior art LBIST design consists of chains of serially connected SRLs. In this typical prior art embodiment, each SRL is a master-slave combination of interconnected bi-stable latches L1 and L2 (e.g. D flip-flops). This typical prior art scan design consists of one or more scan chains of serially connected SRLs, with a system data port, and associated system clocks and scan clocks. An input SRI is connected to an input of the L1 latch at the top of the chain and an output SRO is coupled from the L2 latch at the end of the chain. An output of each L2 latch is coupled as an input to the next succeeding L1 latch in the chain. As illustrated in FIG. 2, the L1 latches also receive inputs from combinational logic elements, which comprise the combinational logic of the device under test, and the L2 latches provide an output to another stage of combinational logic. Clock inputs designated A clock and C1 clock are coupled to clock inputs to the L1 latch and a C2/B clock is coupled to a clock input of the L2 latch. FIG. 2 depicts a master-slave latch LSSD scan chain configuration, which is a typical example of a prior art implementation.

Figure 3:
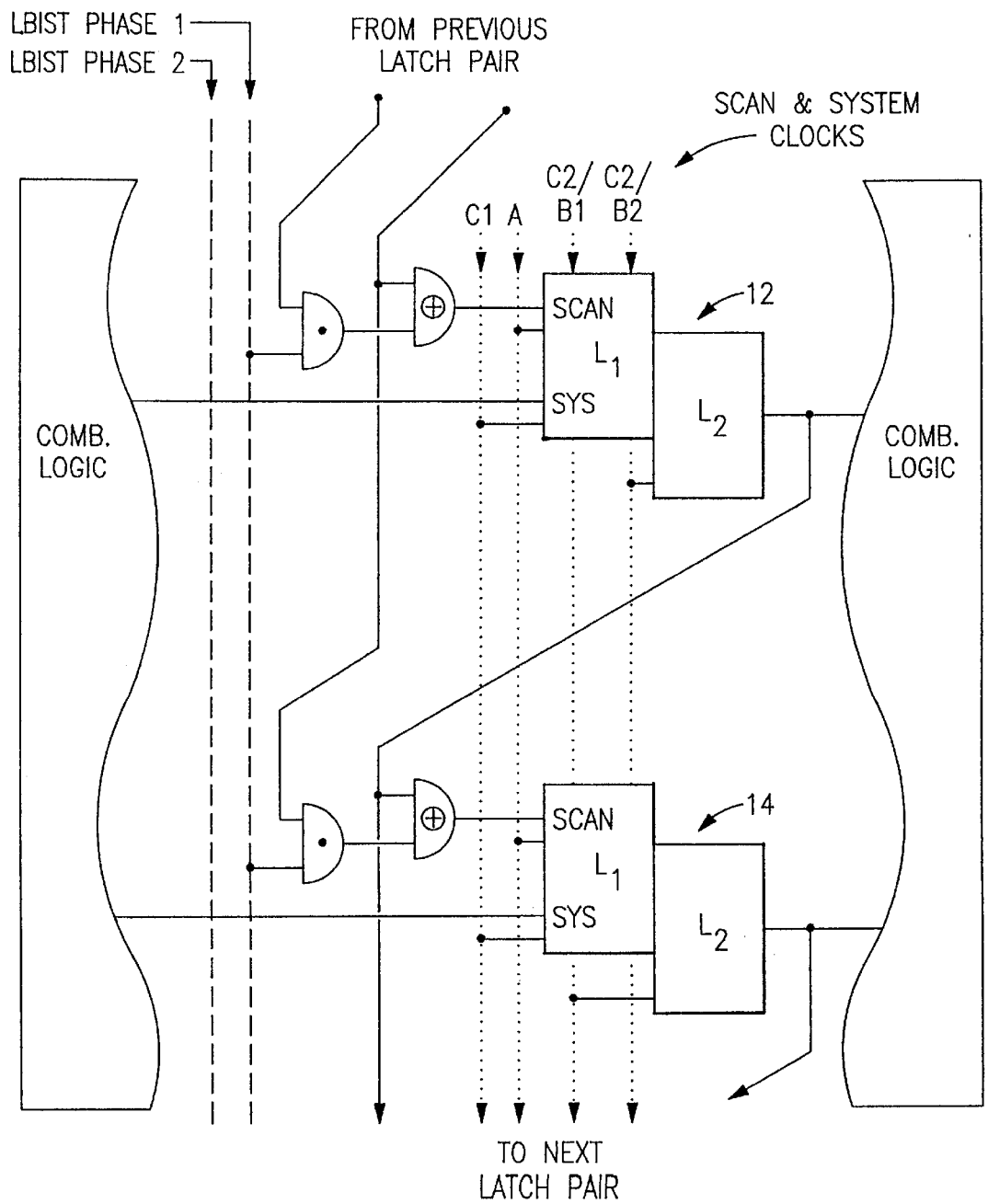
FIG. 3 is a block diagram of a distributed Logic Built In Self Test (LBIST) latch pair, which is the building block of the distributed LBIST in accordance with this invention.
Figure 4:
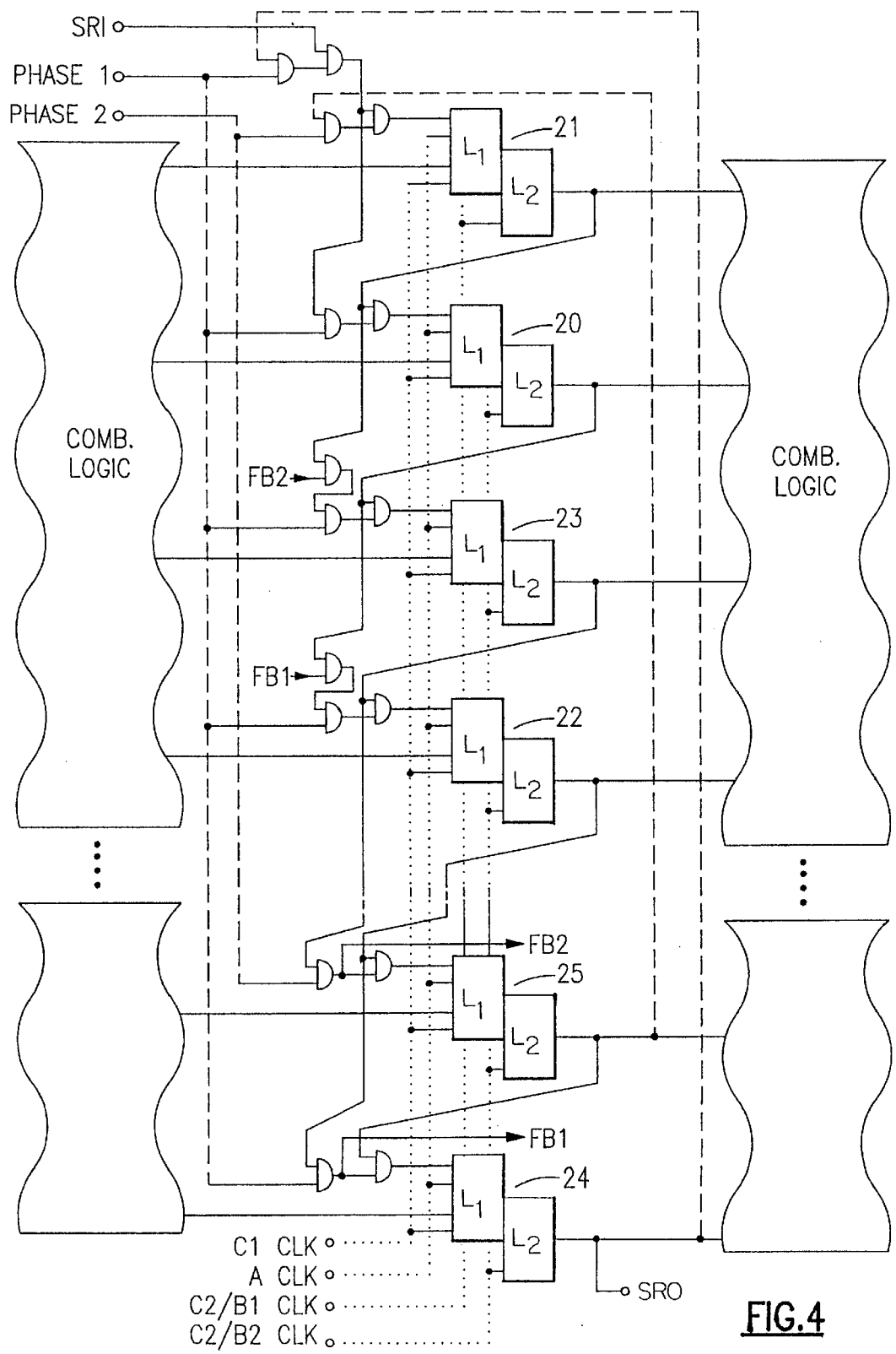
FIG. 4 is a block diagram of a distributed LBIST configuration in accordance with the invention.

Referring now to FIGS. 3 and 4, in accordance with the teachings of this invention, a scan chain connects and clocks consecutive SRLs 12 and 14 in the chain as a pair. One or more chains are configured by concatenating pairs of these latches. Specifically, an L1 latch input for each SRL is XORed with the output of the preceding L2 latch in the chain and the L2 output of the corresponding L2 output of the SRL in the next preceding pairs of SRLs in the chain. Phase 1 and phase 2 clocks gate the inputs from the preceding input pair. A single concatenated chain is shown in FIG. 4 to which reference is now made.

In a first phase, in response to the phase 1 clock, each even SRL (designated in the drawing by the reference numbers 20, 22, and 24) functions as LFSR/MISR latch, while each odd SRL (21, 23, and 25) functions as a MISR input staging element. In a second phase, in response to the phase 2 clock, even and odd SRL swap functionality. This two phase operation allows all system data to be captured while ensuring proper MISR/LFSR cycling.

It will be appreciated that the prior art scan design of FIGS. 2 and 3 has been modified to support the distributed LBIST functions of this invention by making the modifications shown in FIG. 4, namely:

XOR of the previous two stages (L2s) to the scan-in.
Allow phase 1 & 2 configuration gating.

Splitting the B-clock into B1 and B2 clocks.

Provide desired LFSR/MISR feedback.

Incorporating these above changes to the typical scan chain design one can obtain the full configuration for a distributed LBIST chain as shown in FIG. 4, while still maintaining full compatibility to the basic scan design and minimal system performance impact.

Each SRL in this example consists of a master (L1) and a slave (L2) D-type flip-flop or latch. The L1 system data port and associated system clock (C1-clk) perform the same function as in a typical prior art scan design. The L1 scan data port and associated scan clock (A-clk) are also the same except that the input scan data can be an XOR function of the data in the two previous L2 latches in the chain and optional feedback, as shown for SRL (22, 23) in FIG. 4.

The L2 slave latch for each SRL is fed from its associated master L1 latch and is clocked by the C2 system clock (C2-clk) or by the B scan clock (B1 or B2 clks). Note here that the B scan clock has been split into the B1-clk for the even SRL L2s and the B2-clk for the odd SRL L2s.

The integrated LFSR/MISR function is only active in either phase 1 or phase 2 configurations. The last SRL L2 output is connected back to the first L1 input of the corresponding phase configuration, thereby providing a feedback necessary to generate pseudo random patterns as does the LFSR of the prior art. Additionally, one can provide intermediate feedback between latches L2 and L1 of the same phase in the chain, in order to extend configurability FB1 and FB2.

Figure 5:
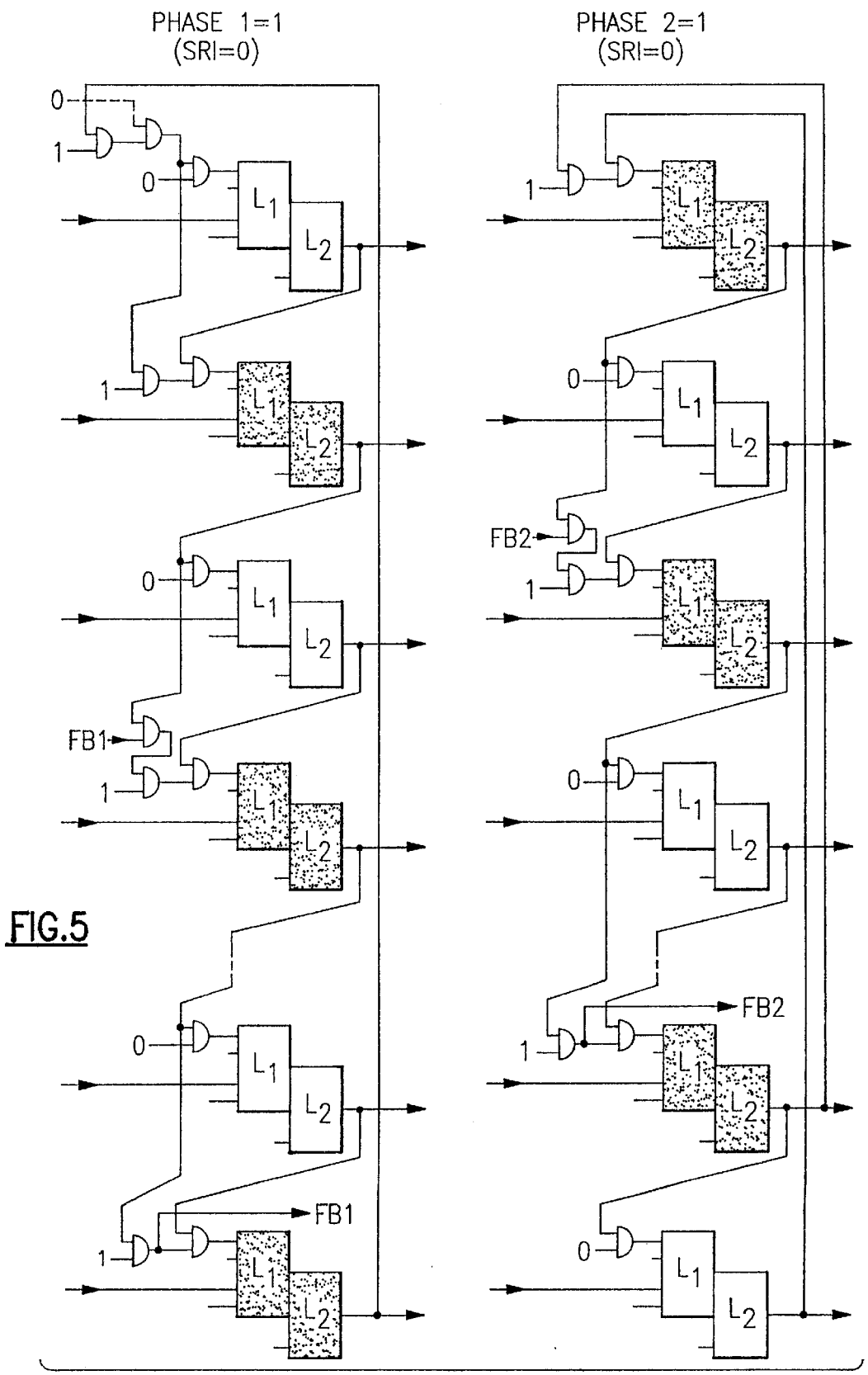
FIG. 5 illustrates phase 1 and a phase 2 LBIST test mode status or systems shown in FIG. 4.

FIG. 5 depicts the two phase configurations. On the left the phase 1 control state is set to "1", the phase 2 is "0" and the SRI is "0" in order to enable the phase 1 LBIST mode. The shaded SRLs function as LFSR/MISR in this case. Conversely, the right side of the figure depicts the phase 2 LBIST mode. Note that holding a "0" to one of the XOR inputs is equivalent to a pass through function.

Figure 6:
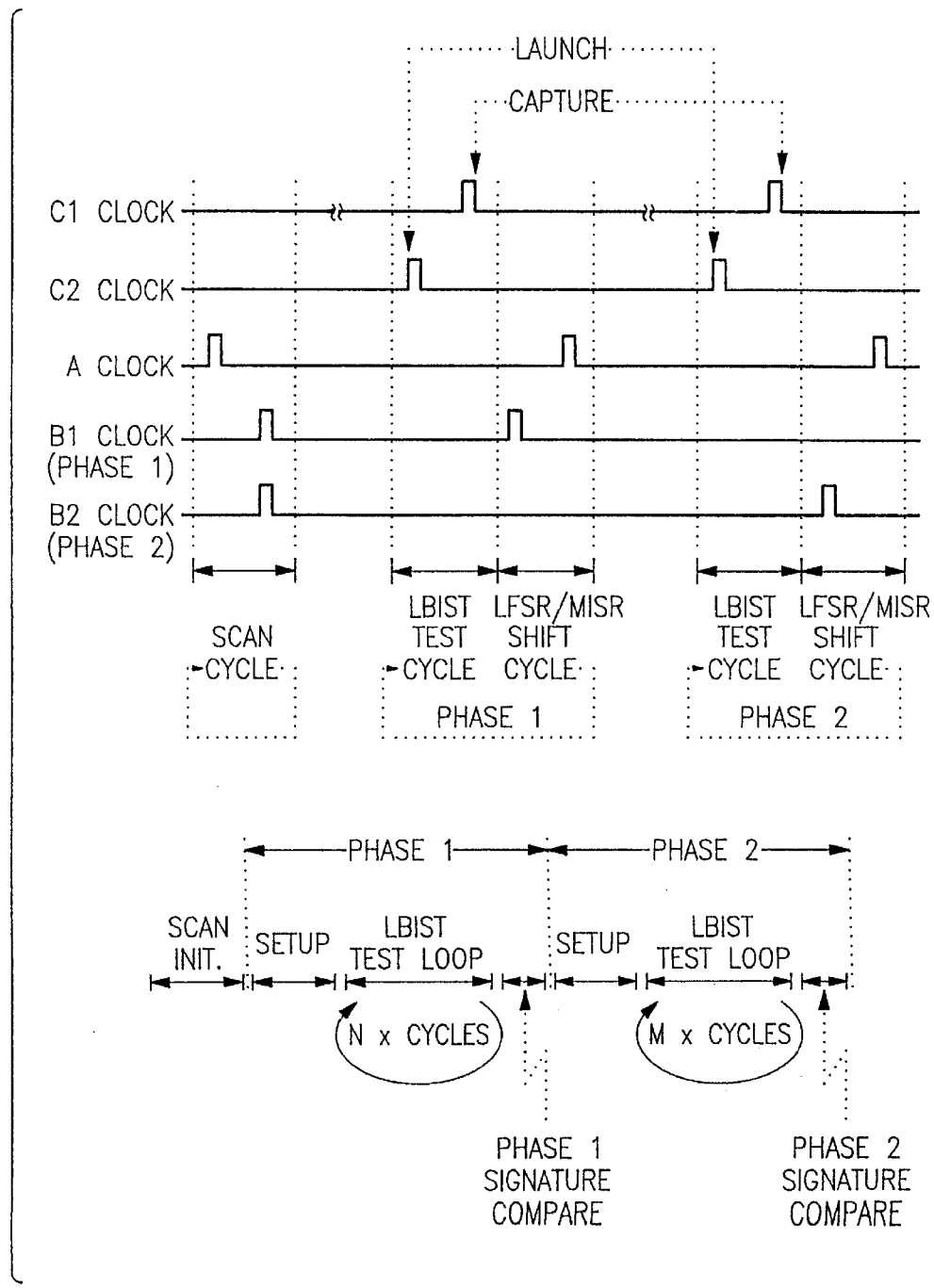
FIG. 6 is a timing diagram illustrating a distributed LBIST timing sequence in accordance with the invention.

A full LBIST test sequence would consist of first initializing the scan chain via a normal scan load operation. This would be normally the default mode with the chip in stability state. Then one would set-up LBIST phase 1 by loading the appropriate test mode registers and by controlling the corresponding primary inputs. Once phase 1 is loaded and activated, the LBIST engine can be started for a predefined number of test cycles. At the completion of the LBIST test one can revert to the basic scan mode and unload and compare the phase 1 signature. This same process can be repeated for LBIST phase 2. This sequence is shown at the bottom of FIG. 6.

The top half of the same figure shows the associated clocks and relative timings for the basic scan cycle, the LBIST test cycle, and the LFSR/MISR shift cycle. Observe that both B1-clk and B2-clk are pulsed during the scan cycle, but only B1-clk is pulsed during the phase 1 LFSR/MISR cycle and only B2-clk is pulsed in phase 2 LFSR/MISR cycle.

Distributed LBIST in accordance with the invention would be implemented as part of the logic synthesis process. The LFSR/MISR connections would be generated during the same process where the scan chains are created. Additional self-test signals would be required for global chip controls. The implementation would be straightforward for "flat" designs, but would require more complex algorithms when applied to a hierarchical macro structured design.

In operation, it should be noted that the logic added to form SRL pairs in the chain with the outputs of one pair as inputs to the next pair with a feedback loop and the added clocks provide an ability to load simultaneously a new test pattern for all the SRLs each scan cycle. This distributed LFSR function can greatly reduce test time. The data in the SRLs at the completion of a test loop is stepped through serially to generate a compressed signature, thus functioning as a distributed MISR.

Although we have concentrated on the implementation of distributed LBIST structures, the concept can be extended to embedded memories with ABIST design methodologies. The highly structured configuration of arrays and many test methods provides us with diverse test methods that are in many instances more effective than signature analysis techniques, but the proposed method complements these techniques and offers further DFT options.

Although we have been discussing the use of this concept for VLSI chips with LBIST structures, the concept can be extended to fully integrated test sub systems. At this level of integration, the sub system would be capable of self test and self diagnosis leading to dynamic self repair. This could result in significant yield improvements at the uP test level by utilizing redundancy enabling techniques.

Similarly, at the system level the benefit of self diagnosis and self repair would be realized by dynamically reconfiguring the system and thereby minimizing system down time. A further extension of this concept in a large system environment would be to generate and store the expected signatures at system bring-up time and then invoke them for system diagnosis when required.

Alternate designs and extensions of this distributed LBIST concept can be designed to allow sophisticated LBIST sequences and functions, but these are beyond the intent of this disclosure.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A logic built in self test method for testing combinational logic, including the steps of:

connecting a plurality of master-slave latches in a scan chain where an output of each latch is coupled to an input to the next latch in the chain;

connecting outputs of the combinational logic to respective inputs of the latches in the chain;

connecting an output of each even latch in the chain to an input of a next successive even latch in the chain through a gated input;

connecting an output of each odd latch in the chain to an input of the next successive odd latch in the chain through a gated input;

feeding back an output of at least one latch in the chain to an input of a prior latch in the chain to configure a distributed LFSR and/or MISR function;

coupling a first phase clock to said even latches in said chain to operate each even latch as a linear feedback shift register/multiple input signature register combination;

coupling a second phase clock to said odd latches in said chain to operate each odd latch as linear feedback shift register/multiple input signature register combination.

2. A logic built in self test method for testing combinational logic as in claim 1, wherein said combinational logic resides on an integrated circuit chip.

3. A logic built in self test method for testing combinational logic as in claim 1, wherein said combinational logic resides on a module.

4. A logic built in self test method for testing combinational logic as in claim 1, wherein said combinational logic resides on an MCM.

5. A logic built in self test method for testing combinational logic as in claim 1, wherein said combinational logic resides in a system or subsystem.

6. A logic build in self test for testing combinational logic, comprising in combination:

a plurality of master-slave latches connected in a scan chain where an output of each latch is coupled as an input to the next latch in the chain;

an output of each even latch in the chain connected to an input of a next successive even latch in the chain through a gated input;

an output of each odd latch in the chain connected to an input of a next successive odd latch in the chain through a gated input;

an output of at least one latch in the chain feedback as an input to a prior latch in the chain to configure a distributed LFSR and/or MISR function;

a first phase clock coupled to said even latches in said chain to operate said even latches as a linear feedback shift register/multiple input signature register combination; and a second phase clock coupled to said odd latches in said chain to operate said odd latches as a linear feedback shift register/multiple input signature register combination.

7. A built in self test method for testing logic elements, including the steps of:
   connecting a plurality of logic elements in a chain where an output of each logic element is coupled to an input to the next element in the chain;
   connecting an output of each even element in the chain to an input of a next successive even element in the chain through a gated input;
   connecting an output of each odd element in the chain to an input of the next successive odd element in the chain through a gated input;
   feeding back an output of at least one element in the chain to an input of a prior element in the chain to configure a distributed LFSR and/or MISR function;
   coupling a first phase clock to said even elements in said chain to operate each even element as a linear feedback shift register/multiple input signature register combination;
   coupling a second phase clock to said odd elements, in said chain to operate each odd element as linear feedback shift register/multiple input signature register combination.

8. A built in self test method for testing logic elements as in claim 6, wherein said method is an array built in logic self test design method.

* * * * *